(12) United States Patent
Chen et al.

(10) Patent No.: US 9,088,252 B2
(45) Date of Patent: *Jul. 21, 2015

(54) FIXED VOLTAGE GENERATING CIRCUIT

(71) Applicant: RichWave Technology Corp., Taipei (TW)

(72) Inventors: Chih-Sheng Chen, Taipei (TW); Chuan-Jane Chao, Taipei (TW)

(73) Assignee: RichWave Technology Corp., NeiHu District, Taipei (TW)

( * ) Notice: Subject to any disclaimer, the term of this patent is extended or adjusted under 35 U.S.C. 154(b) by 0 days.

This patent is subject to a terminal disclaimer.

(21) Appl. No.: 14/197,220

(22) Filed: Mar. 5, 2014

(65) Prior Publication Data

US 2014/0253088 A1    Sep. 11, 2014

Related U.S. Application Data

(63) Continuation-in-part of application No. 13/865,205, filed on Apr. 18, 2013.

(30) Foreign Application Priority Data

Mar. 5, 2013    (TW) ................................. 102107705

(51) Int. Cl.
*G05F 3/16*     (2006.01)
*H03F 3/45*     (2006.01)
(52) U.S. Cl.
CPC .................................. *H03F 3/45085* (2013.01)

(58) Field of Classification Search
CPC ..................................... G05F 3/26; H03F 3/00
USPC ........................... 323/313–317; 327/538–540
See application file for complete search history.

(56) References Cited

U.S. PATENT DOCUMENTS

| | | | | | |
|---|---|---|---|---|---|
| 4,492,929 | A | * | 1/1985 | Vyne | 330/253 |
| 4,495,425 | A | * | 1/1985 | McKenzie | 327/541 |
| 5,808,507 | A | * | 9/1998 | Melse et al. | 327/538 |
| 6,002,276 | A | | 12/1999 | Wu | |
| 2005/0030000 | A1 | | 2/2005 | Hayashimoto | |
| 2009/0051416 | A1 | | 2/2009 | Ibuka | |
| 2014/0253087 | A1 | * | 9/2014 | Chen | 323/313 |

FOREIGN PATENT DOCUMENTS

| | | | |
|---|---|---|---|
| JP | 6232663 | A | 8/1994 |
| JP | 7106875 | A | 4/1995 |
| JP | 11186860 | A | 7/1999 |
| JP | 2000174562 | A | 6/2000 |
| JP | 2009-21685 | * | 1/2009 |

OTHER PUBLICATIONS

Ting-Hua Yun, Jian-Hui Wu, Long-Xing Shi, "A novel CMOS exponential voltage generator based on differential pair's transfer characteristic", May 2005, 2005 IEEE, pp. 1091-1094.

* cited by examiner

*Primary Examiner* — Matthew Nguyen
(74) *Attorney, Agent, or Firm* — Winston Hsu; Scott Margo (57) ABSTRACT

A fixed voltage generating circuit includes a current mirror, a differential pair, and a resistor coupled to the current mirror. A node of the resistor is coupled to a voltage source. The differential pair includes two resistors coupled to the voltage source to enable the differential pair outputting a stable output voltage.

20 Claims, 9 Drawing Sheets

FIG. 10

FIXED VOLTAGE GENERATING CIRCUIT

CROSS REFERENCE TO RELATED APPLICATIONS

This application is a continuation-in-part application of U.S. patent application Ser. No. 13/865,205 filed on Apr. 18, 2013.

BACKGROUND OF THE INVENTION

1. Field of the Invention

The invention is related to a fixed voltage generating circuit, and more particularly, to a fixed voltage generating circuit fabricated using a GaAs (GALLIUM ARSENIDE) process.

2. Description of the Prior Art

An RF power amplifier fabricated using a GaAs process has good performance and high efficiency, specifically, the RF power amplifier is less prone to signal distortion and has a lower noise to signal ratio, lower power consumption, higher gain, and smaller size. Thus the RF power amplifier gains advantages of shrinking sizes, increasing efficiency, and lowering power consumption of electronic components, and is suitable for use in mobile phones and various of communication devices.

In order that the RF power amplifier fabricated using a GaAs process can function normally under a wide input voltage range, a fixed voltage generated by a fixed voltage generating circuit is provided for operations of the RF power amplifier to ensure the RF power amplifier can function normally.

However the fixed voltage generating circuit is usually fabricated using a CMOS (complementary metal-oxide-semiconductor) process, which includes PMOS (P-type metal-oxide-semiconductor) that is not adoptable in GaAs process. Thus the fixed voltage generating circuit cannot be integrated and fabricated in the same GaAs process when fabricating the RF power amplifier. Instead, an additional CMOS process is needed for fabricating the fixed voltage generating circuit to provide the fixed voltage to the RF power amplifier, thereby increasing area consumption and lowering integration level of related circuit blocks.

SUMMARY OF THE INVENTION

One embodiment of the present invention discloses a fixed voltage generating circuit. The fixed voltage generating circuit comprises a first resistor, a first transistor, a second transistor, a third transistor, a fourth transistor, a second resistor, and a third resistor. The first resistor has a first end and a second end. The second end of the first resistor is coupled to a voltage source. The first transistor has a control end, a first end, and a second end. The control end of the first transistor is coupled to the first end of the first resistor, the first end of the first transistor is coupled to a ground node, and the second end of the first transistor is coupled to the control end of the first transistor. The second transistor has a control end, a first end, and a second end. The control end of the second transistor is coupled to the control end of the first transistor, and the first end of the second transistor is coupled to the ground node. The third transistor has a control end, a first end, and a second end. The control end of the third transistor is for receiving a first differential voltage, and the first end of the third transistor is coupled to the second end of the second transistor. The fourth transistor has a control end, a first end, and a second end. The control end of the fourth transistor is for receiving a second differential voltage, and the first end of the fourth transistor is coupled to the second end of the second transistor. The second resistor has a first end and a second end. The first end of the second resistor is coupled to the second end of the third transistor, and the second end of the second resistor is coupled to the voltage source. The third resistor has a first end and a second end. The first end of the third resistor is coupled to the second end of the fourth transistor, and the second end of the third resistor is coupled to the voltage source. Also, the resistance of the second resistor and the resistance of the third resistor are related to the resistance of the first resistor.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
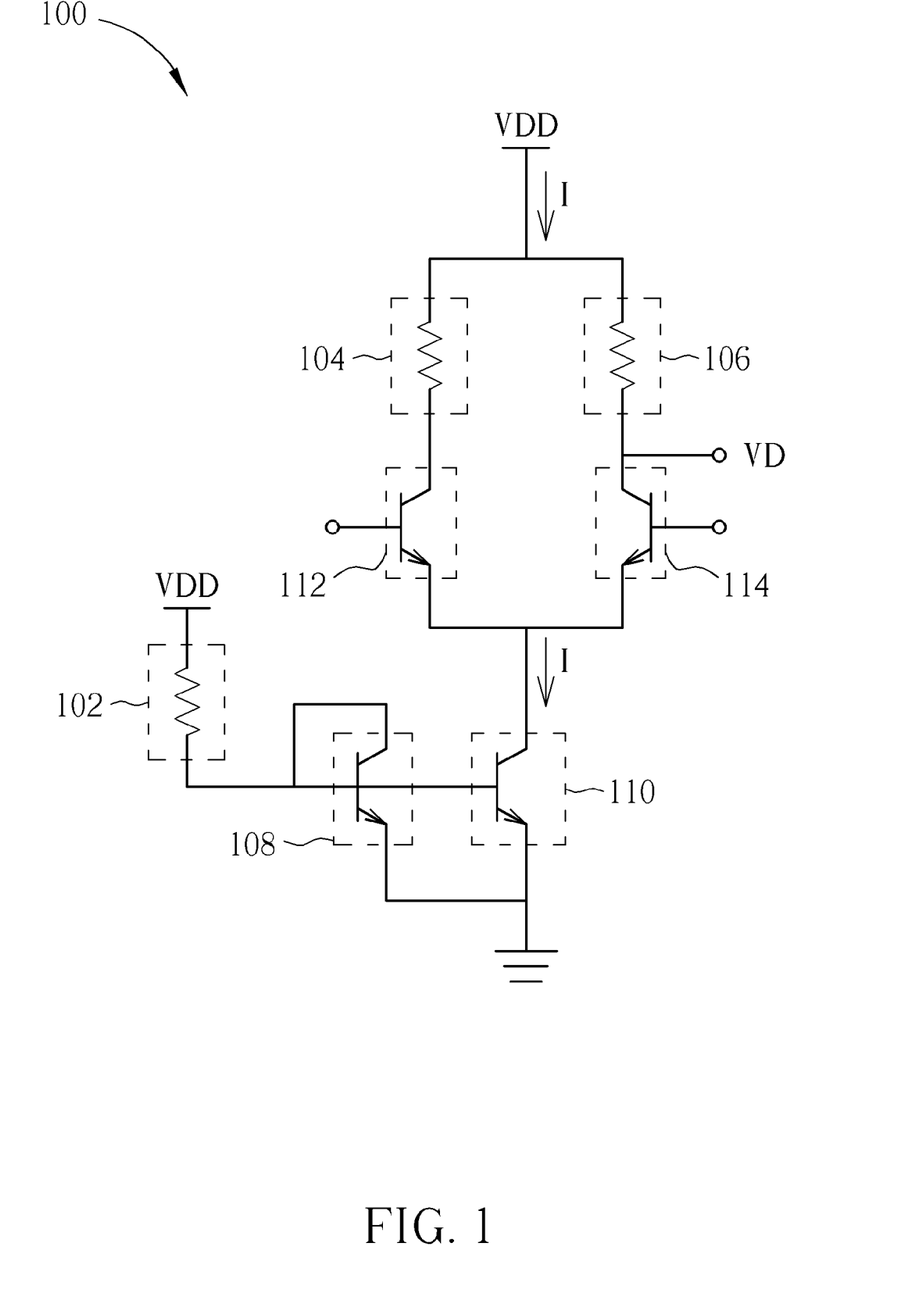
FIGS. 1 to 5 and 8 to 10 show fixed voltage generating circuits according to embodiments of the present invention.

Please refer to FIG. 1 which shows a fixed voltage generating circuit 100 according to an embodiment of the present invention. The fixed voltage generating circuit 100 includes a first resistor 102, a second resistor 104, a third resistor 106, a first transistor 108, a second transistor 110, a third transistor 112, and a fourth transistor 114. The first resistor 102 has a first end and a second end. The second end of the first resistor 102 is coupled to a voltage source VDD. The first transistor 108 has a control end, a first end, and a second end. The control end of the first transistor 108 is coupled to the first end of the first resistor 102, the first end of the first transistor 108 is coupled to a ground node, and the second end of the first transistor 108 is coupled to the control end of the first transistor 108. The second transistor 110 has a control end, a first end, and a second end. The control end of the second transistor 110 is coupled to the control end of the first transistor 108 and the first end of the second transistor 110 is coupled to the ground node. The third transistor 112 has a control end, a first end, and a second end. The control end of the third transistor 112 is for receiving a first differential voltage and the first end of the third transistor 112 is coupled to the second end of the second transistor 110. The fourth transistor 114 has a control end, a first end, and a second end. The control end of the fourth transistor 114 is for receiving a second differential voltage and the first end of the fourth transistor 114 is coupled to the second end of the second transistor 110. The second resistor 104 has a first end and a second end. The first end of the second resistor 104 is coupled to the second end of the third transistor 112 and the second end of the second resistor 104 is coupled to the voltage source VDD. The third resistor 106 has a first end and a second end. The first end of the third resistor 106 is coupled to the second end of the fourth transistor 114 and the second end of the third resistor 106 is coupled to the voltage source VDD. The resistance ratio of the first resistor 102, the second resistor 104, and the third resistor 106 is substantially equal to 1:2:2, and the resistance of the second resistor 104 and the resistance of the third resistor 106 are substantially equal. The size ratio of the first transistor 108 and the second transistor 110 is equal to 1:1.

In FIG. 1, a bias voltage is generated at the control end of the first transistor 108 from the voltage source VDD via the first resistor 102. The first transistor 108 and the second transistor 110 form a current mirror, namely, a mirrored current source. A bias current I, corresponding to a current flowing through the first transistor 108, is generated at the second end of the second transistor 110 according to a bias voltage at the control end of the second transistor 110. The bias voltage at the control end of the second transistor 110 is biased by the bias voltage at the control end of the first transistor 108. The bias current I can be derived by calculating the current flowing through the first transistor 108, as in Formula (1):

$$I = \frac{VDD - V_{t1}}{R1} \quad \text{Formula (1)}$$

In Formula (1), $V_{t1}$ is the threshold voltage of the first transistor 108 and R1 is the resistance of the first resistor 102. The bias current I flows through a differential pair formed by the third transistor 112, the fourth transistor 114, the second resistor 104, and the third resistor 106. A current flowing through the right side of the differential pair, including the fourth transistor 114 and the third resistor 106, is half the bias current I because components in the right side and components in the left side of the differential pair are substantially symmetrical. The differential pair is coupled to the voltage source VDD and thus an output voltage VD is generated at the second end of the fourth transistor 114, as in Formula (2):

$$VD = VDD - \frac{I}{2} \times R3 = \quad \text{Formula (2)}$$
$$VDD - I \times Re1 = VDD - \frac{VDD - V_{t1}}{R1} \times Re1$$

In Formula (2), R3 is the resistance of the third resistor 106, and Re1 is the equivalent resistance of the second resistor 104 and the third resistor 106. Because of the symmetrical structure of the differential pair, Re1 is equal to a resistance of the second resistor 104 and the third resistor 106 in parallel. Also, the resistance of the second resistor 104 and the resistance of the third resistor 106 are substantially equal; therefore, $$Re1 = \frac{R3}{2}.$$

In this embodiment, the resistance ratio of the first resistor 102, the second resistor 104 and the third resistor 106 is 1:2:2, which means Re1=R1. Consequently, the output voltage VD is equal to $V_{t1}$, the threshold voltage of the first transistor 108 according to Formula (2).

According to Formula (1), when the voltage source VDD varies, the bias current I flowing through the differential pair changes accordingly as in Formula (3). In Formula (3), dVDD represents a voltage variation of the voltage source VDD, and dI represents a current variation of the bias current I. At the same time, the output voltage VD at the second end of the fourth transistor 114 will also change as in Formula (4). In Formula (4), dVD represents a voltage variation of the output voltage VD. In Formula (4), if R1=Re1, that is, the resistance of the first resistor 102 is substantially equal to the equivalent resistance Re1 of the second resistor 104 and the third resistor 106, then the voltage variation dVD of the output voltage VD is substantially equal to zero, namely, the output voltage VD is kept fixed and does not change with the voltage variation dVDD of the voltage source VDD.

$$dI = \frac{dVDD}{R1} \quad \text{Formula (3)}$$

$$dVD = dVDD - \frac{dI}{2} \times R3 = \quad \text{Formula (4)}$$
$$dVDD - dI \times Re1 = dVDD - \frac{dVDD}{R1} \times Re1$$

As illustrated above, in FIG. 1, the fixed voltage generating circuit 100 is capable of generating a stable output voltage VD so that the fixed voltage generating circuit 100 is able to work under a wide range of input voltages. In the prior art, the second resistor 104 and the third resistor 106 are replaced with PMOSs in CMOS process. The PMOSs are not adoptable in GaAs process, thus the prior art circuit structure used in CMOS process becomes impractical for GaAs process. However by adjusting a resistance ratio of multiple resistors and implementing a circuit structure of connecting resistors to the voltage source VDD, as described in the embodiment of the present invention, the fixed output voltage VD can be generated from a GaAs circuit without the need of integrating a CMOS circuit, so as to reduce area consumption and to enhance integration level of related circuit blocks.

Furthermore, in FIG. 1, the size ratio of the first transistor 108 and the second transistor 110 can be changed from 1:1 to 1:N, where N is a positive integer. In this case, if the equivalent resistance Re1 of the second resistor 104 and the third resistor 106 is equal to the resistance R1 of the first resistor 102 divided by N, that is, if $$Re1 = \frac{R1}{N},$$

then the output voltage VD will remain fixed and will not change with the voltage variation dVDD of the voltage source VDD. Furthermore, the decrement of the equivalent resistance Re1 can reduce the area consumption of the circuit. In one embodiment, N is equal to 2 so that the resistance of the first resistor 102, the resistance of the second resistor 104, and the resistance of the third resistor 106 are all substantially equal to each other. The inaccuracy caused by manufacturing variations can thus be reduced due to the same size of each of the resistors 102, 104 and 106.

In FIG. 1, the size ratio of the first transistor 108 and the second transistor 110 can be changed from 1:1 to N:1, where N is a positive integer. In this case, if the equivalent resistance Re1 of the second resistor 104 and the third resistor 106 is equal to the resistance R1 of the first resistor multiplied by N, that is, if Re1=N*R1, then the output voltage VD will still be fixed and will not change with the voltage variation dVDD of the voltage source VDD. Furthermore, the increment of the equivalent resistance Re1 can reduce current consumption.

Figure 2:
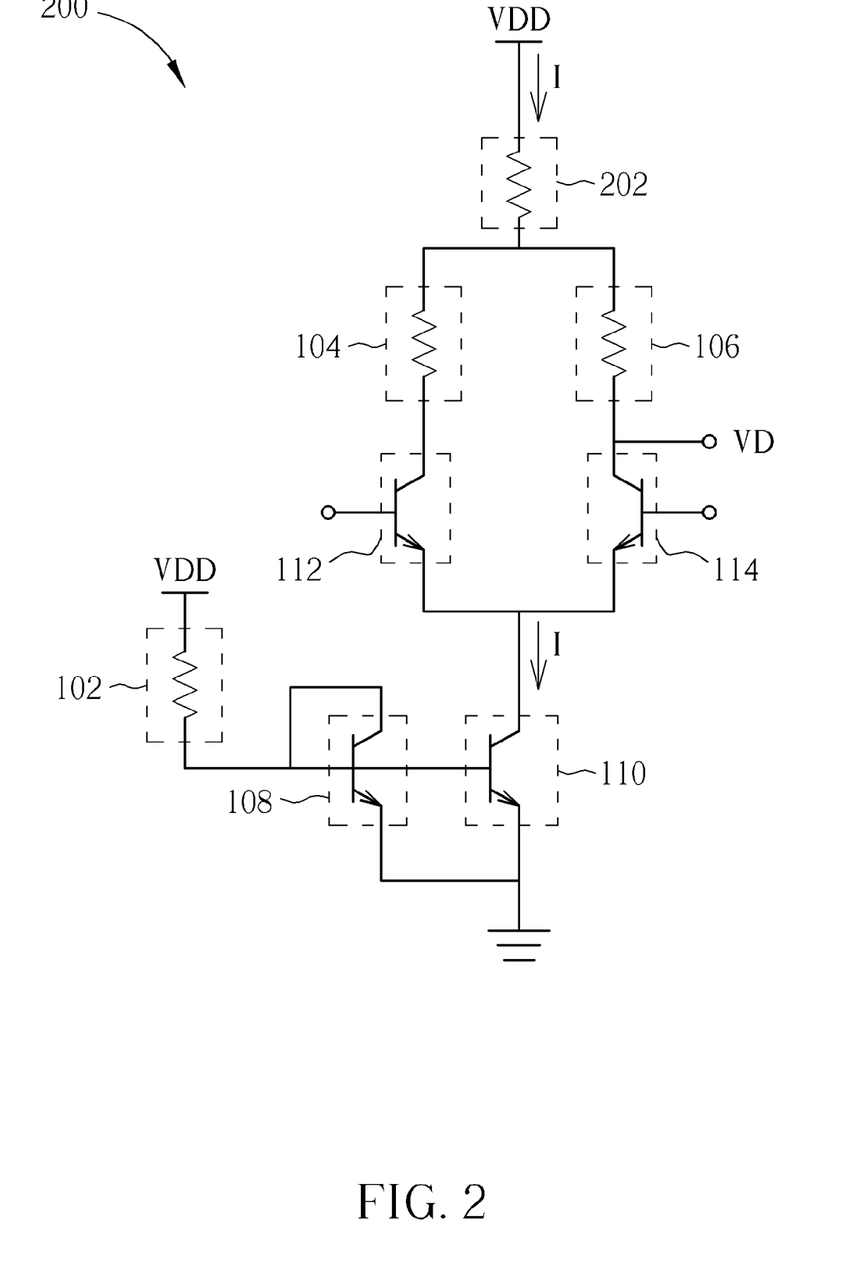

Please refer to FIG. 2 which shows a fixed voltage generating circuit 200 according to another embodiment of the present invention. The fixed voltage generating circuit 200 includes all components of the fixed voltage generating circuit 100 and further includes a fourth resistor 202. The second resistor 104 and the third resistor 106 of FIG. 2 are not coupled directly to the voltage source VDD but are coupled to the voltage source VDD via the fourth resistor 202. The fourth resistor 202 has a first end and a second end. The first end of the fourth resistor 202 is coupled to the second end of the second resistor 104 and the second end of the third resistor 106. The second end of the fourth resistor 202 is coupled to the voltage source VDD. The equivalent resistance of the second resistor 104, the third resistor 106, and the fourth resistor 202 is substantially equal to the resistance of the first resistor 102. The resistance of the second resistor 104 and the resistance of the third resistor 106 are substantially equal.

The same principle of Formula (1) and Formula (3) may be applied in FIG. 2. The bias current I flows through the fourth resistor 202 and the differential pair formed by the third transistor 112, the fourth transistor 114, the second resistor 104, and the third resistor 106. A current flowing through the right side of the differential pair, including the fourth transistor 114 and the third resistor 106, is half the bias current I because components in the right side and components in the left side of the differential pair are substantially symmetrical. The fourth resistor 202 is coupled to the voltage source VDD thus the output voltage VD is generated at the second end of the fourth transistor 114, as in Formula (5):

$$VD = VDD - I \times R4 - \frac{I}{2} \times R3 = \qquad \text{Formula (5)}$$
$$VDD - I \times Re2 = VDD - \frac{VDD - V_{t1}}{R1} \times Re2$$

In Formula (5), R3 is the resistance of the third resistor 106, R4 is the resistance of the fourth resistor 202, and Re2 is the equivalent resistance of the second resistor 104, the third resistor 106, and the fourth resistor 202. Since the differential pair is a symmetric structure, the equivalent resistance of the second resistor 104 and the third resistor 106 is equal to the resistance of the second resistor 104 and the third resistor 106 in parallel. Re2 is equal to the resistance of the second resistor 104 and the third resistor 106 in parallel plus the resistance of the fourth resistor 202. The resistance of the second resistor 104 and the resistance of the third resistor 106 are substantially equal. Thus $$Re2 = \frac{R3}{2} + R4.$$

In this embodiment, Re2 is equal to R1 so that the output voltage VD is equal to $V_{t1}$, the threshold voltage of the first transistor 108, according to Formula (5).

When the voltage source VDD varies, the bias current I flowing through the differential pair changes accordingly as in Formula (3). At the same time, the output voltage VD at the second end of the fourth transistor 114 will also change as in Formula (6). In Formula (6), dVD represents a voltage variation of the output voltage VD. In Formula (6), if R1=Re2, that is, the resistance of the first resistor 102 is substantially equal to the equivalent resistance Re2 of the second resistor 104, the third resistor 106, and the fourth resistor 202, the voltage variation dVD of the output voltage VD is substantially equal to zero, namely, the output voltage VD is fixed and does not change with the voltage variation dVDD of the voltage source VDD.

$$dVD = dVDD - dI \times R4 - \frac{dI}{2} \times R3 = \qquad \text{Formula (6)}$$
$$dVDD - dI \times Re2 = dVDD - \frac{dVDD}{R1} \times Re2$$

As illustrated above, in FIG. 2, the fixed voltage generating circuit 200 is capable of generating a stable output voltage VD, which doesn't change with the voltage source VDD, and thus can work properly under a wide range of input voltages by using a GaAs process and without the need of integrating CMOS circuits.

Figure 3:
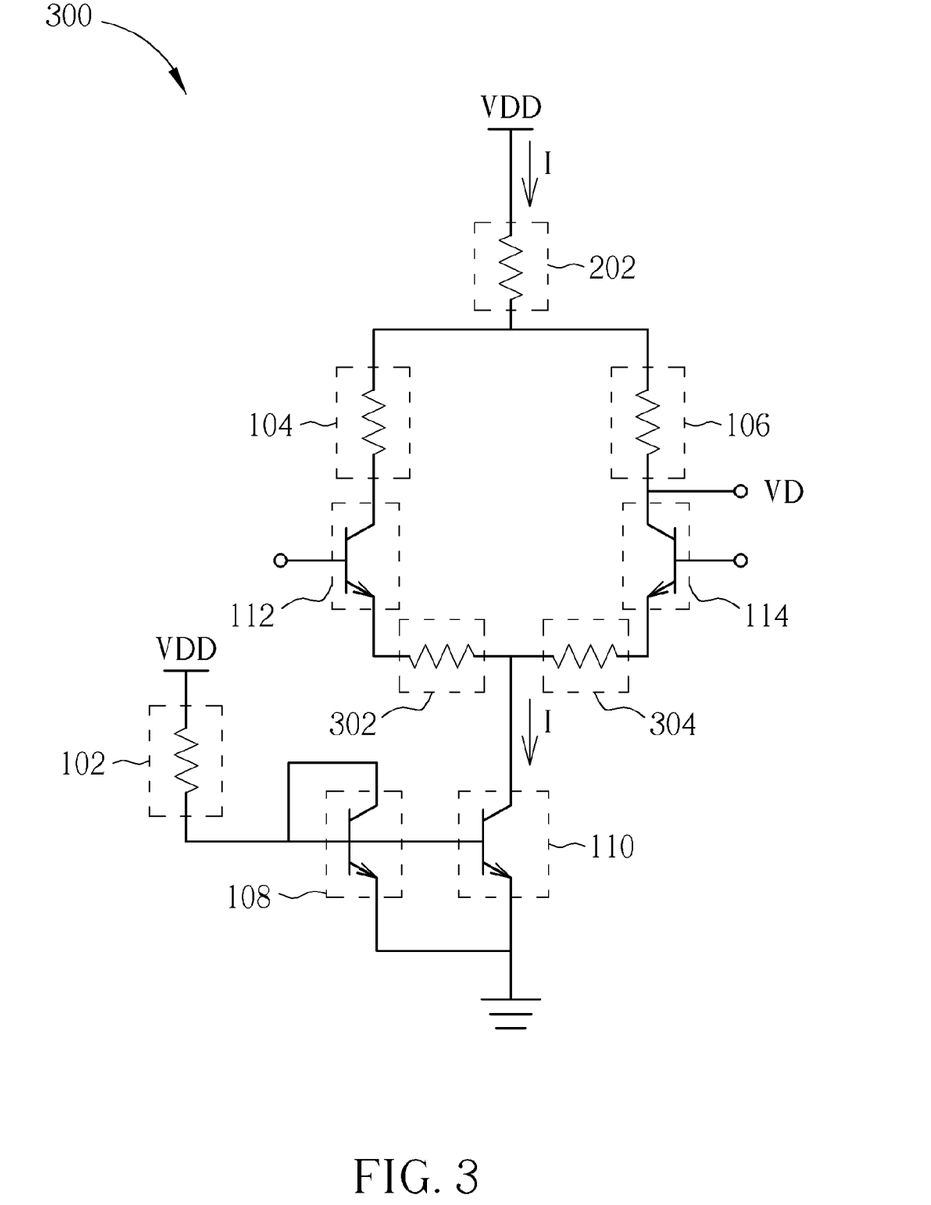

Please refer to FIG. 3 which shows a fixed voltage generating circuit 300 according to another embodiment of the present invention. The fixed voltage generating circuit 300 includes all components of the fixed voltage generating circuit 200 and further includes a fifth resistor 302 coupled between the first end of the third transistor 112 and the second end of the second transistor 110, and a sixth resistor 304 coupled between the first end of the fourth transistor 114 and the second end of the second transistor 110. The fifth resistor 302 and the sixth resistor 304 are emitter degeneration resistors used to provide negative feedbacks, to increase the input impedance of the differential pair, and to widen the input voltage range of the differential pair.

In FIG. 3, the bias current I flows through the fourth resistor 202, the differential pair, the fifth resistor 302, and the sixth resistor 304. A current flowing through the right side of the differential pair is half the bias current I as the resistance of the second resistor 104 equals to the resistance of the third resistor 106 and the resistance of the fifth resistor 302 equals to the resistance of the sixth resistor 304. The same principle of Formula (1), (3), (5), and (6) can be applied in FIG. 3. As long as R1=Re2, that is, the resistance of the first resistor 102 is substantially equal to the equivalent resistance Re2 of the second resistor 104, the third resistor 106, and the fourth resistor 202, the voltage variation dVD of the output voltage VD is substantially equal to zero, namely, the output voltage VD is fixed and does not change with the voltage variation dVDD of the voltage source VDD.

Figure 4:
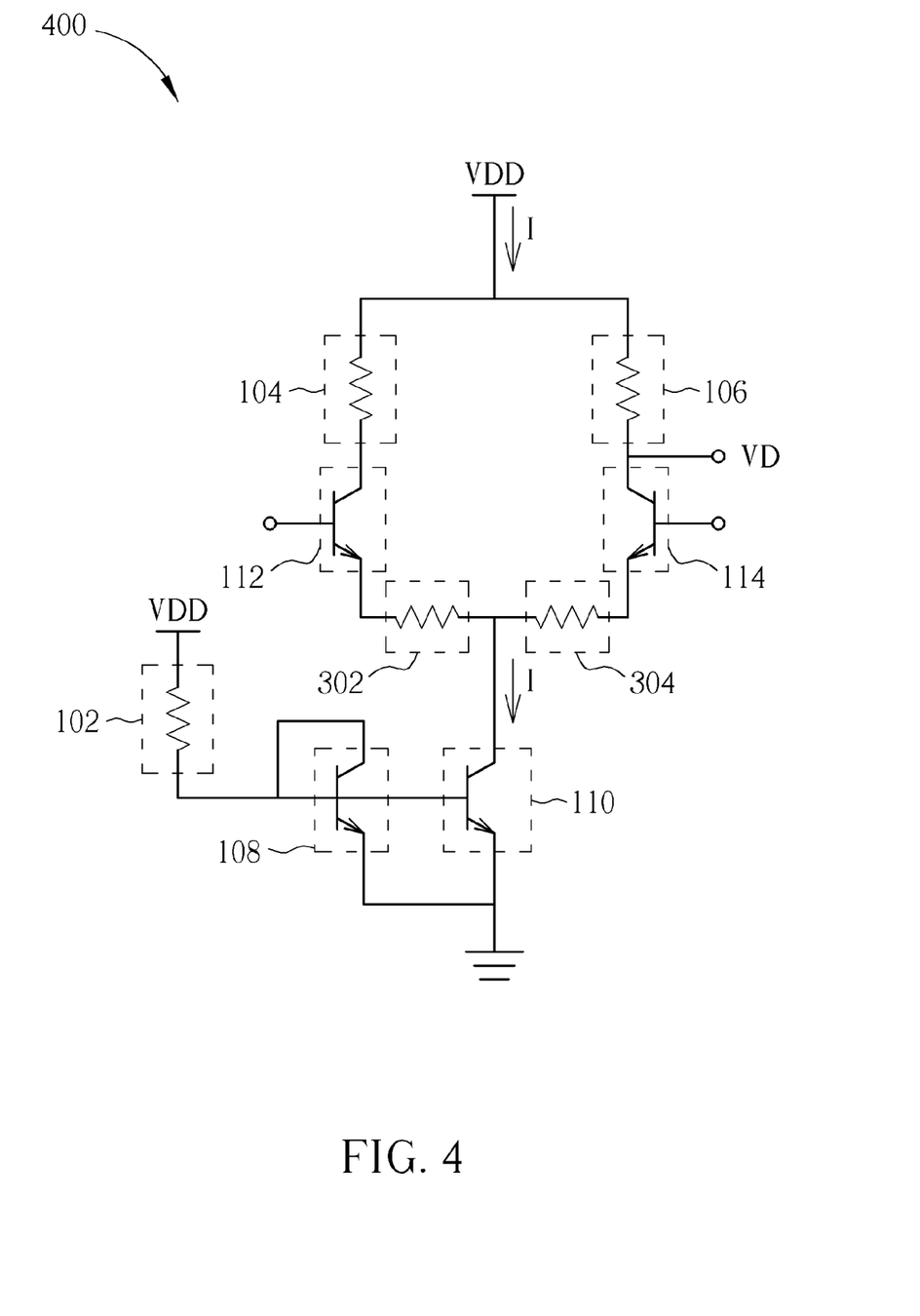

Please refer to FIG. 4 which shows a fixed voltage generating circuit 400 according to another embodiment of the present invention. The fixed voltage generating circuit 400 includes all components of the fixed voltage generating circuit 100 and further includes a fifth resistor 302 coupled between the first end of the third transistor 112 and the second end of the second transistor 110, and a sixth resistor 304 coupled between the first end of the fourth transistor 114 and the second end of the second transistor 110.

In FIG. 4, the bias current I flows through the differential pair, the fifth resistor 302, and the sixth resistor 304. A current flowing through the right side of the differential pair is half the bias current I. The same principles of Formula (1) to (4) can be applied in FIG. 4. As long as R1=Re1, that is, the resistance of the first resistor 102 is substantially equal to the equivalent resistance Re1 of the second resistor 104 and the third resistor 106, the voltage variation dVD of the output voltage VD is substantially equal to zero, namely, the output voltage VD is fixed and does not change with the voltage variation dVDD of the voltage source VDD.

Figure 5:
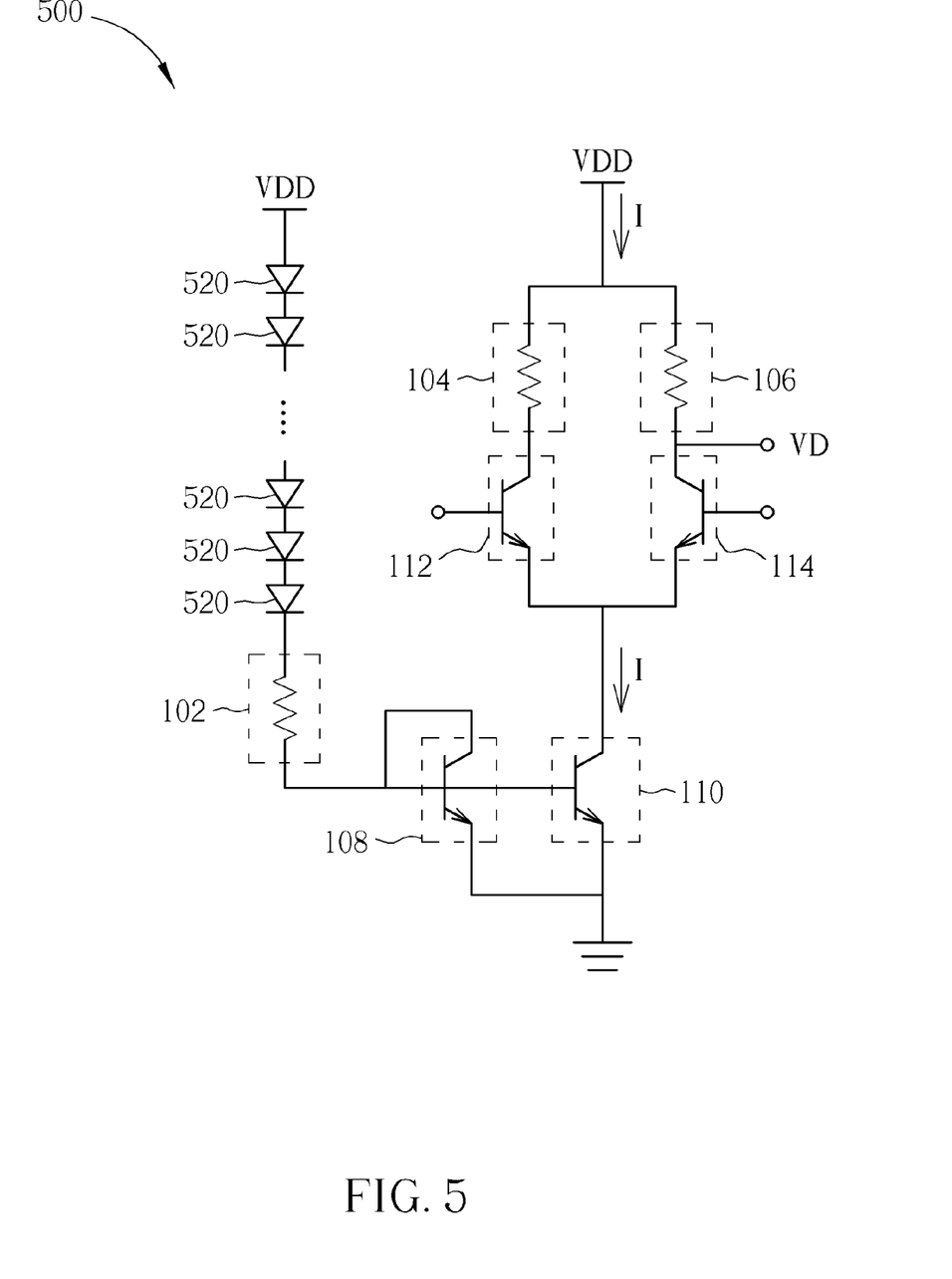

Please refer to FIG. 5 which shows a fixed voltage generating circuit 500 according to another embodiment of the present invention. The fixed voltage generating circuit 500 includes all components of the fixed voltage generating circuit 100 and further includes n diodes 520 where n is a positive integer. The n diodes 520 are all forward biased and are in series with the first resistor 102. That is, for each diode 520, its anode voltage is higher than its cathode voltage. In FIG. 5, diodes 520 are disposed between the voltage source VDD and the first resistor 102. In another embodiment, the first resistor 102 can be disposed between the voltage source VDD and the n diodes 520. In yet another embodiment, the first resistor 102 can be disposed between any two of the diodes 520. Furthermore, the first resistor 102 can be formed by a plurality of resistors distributed anywhere between the voltage source VDD and the control end of the first transistor 108 where the equivalent resistance of the plurality of resistors equals to the resistance of the first resistor 102. However, this invention is not limited to the aforesaid embodiments.

Figure 6:
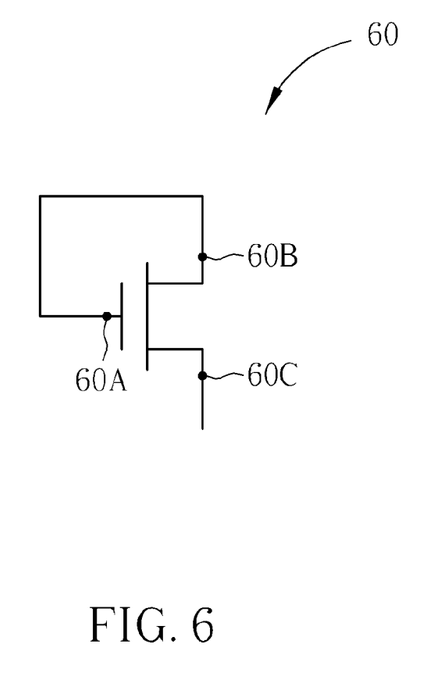
FIG. 6 illustrates how a diode is formed by a field effect transistor.
Figure 7:
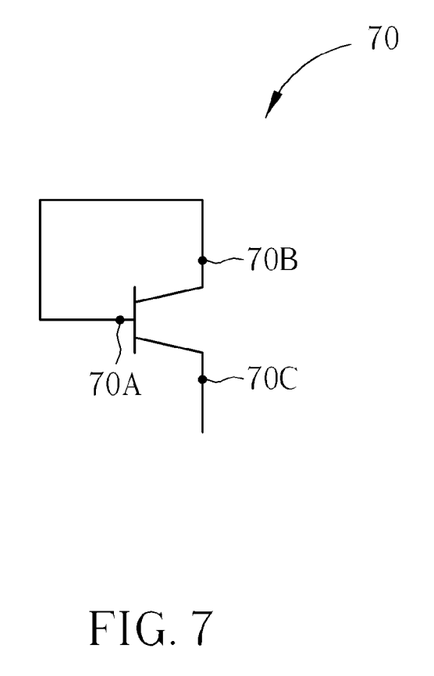
FIG. 7 illustrates how a diode is formed by a bipolar junction transistor.

In one embodiment, the diodes 520 could be junction diodes, field effect transistors, or bipolar junction transistors. Please refer to FIG. 6 which illustrates how a field effect transistor 60 forms the diode 520. The field effect transistor 60 has a control end 60A, a first end 60B, and a second end 60C. In one embodiment, the field effect transistor 60 is an N-type field effect transistor where the control end 60A coupled to the first end 60B functions as the anode of the diode 520, and the second end 60C functions as the cathode of the diode 520. In another embodiment, the field effect transistor 60 is a P-type field effect transistor where the control end 60A coupled to the second end 60B functions as the cathode of the diode 520, and the second end 60C functions as the anode of the diode 520. Please refer to FIG. 7 which illustrates how a bipolar junction transistor 70 forms the diode 520. The bipolar junction transistor 70 has a control end 70A, a first end 70B and a second end 70C. In one embodiment, the bipolar junction transistor 70 is a PNP-type bipolar junction transistor where the control end 70A coupled to the first end 70B functions as the cathode of the diode 520, and the second end 70C functions as the anode of the diode 520. In another embodiment, the bipolar junction transistor 70 is an NPN-type bipolar junction transistor where the control end 70A coupled to the second end 70B functions as the anode of the diode 520, and the second end 70C functions as the cathode of the diode 520.

The difference between the fixed voltage generating circuit 500 and the fixed voltage generating circuit 100 is that the control end of the first transistor 108 is biased from the voltage source VDD via the first resistor 102 and the n diodes 520 according to the fixed voltage generating circuit 500. Since the first transistor 108 and the second transistor 110 form a current mirror, the bias current I is generated according to the bias voltage at the control end of the second transistor 110. The bias voltage at the control end of the second transistor 110 is biased by the bias voltage at the control end of the first transistor 108. The bias current I can be derived by calculating the current flowing through the first transistor 108, as in Formula (7):

$$I = \frac{\left(VDD - V_{t1} - \sum_{k=1}^{n} V_{Dk}\right)}{R1} \qquad \text{Formula (7)}$$

In Formula (7), $V_{t1}$ is the threshold voltage of the first transistor 108 and $V_{Dk}$ is the turn-on voltage of the $k^{th}$ diode 520. The bias current I flows through the differential pair composed of the third transistor 112, the fourth transistor 114, the second resistor 104, and the third resistor 106. A current flowing through the right side of the differential pair, including the fourth transistor 114 and the third resistor 106, is half the bias current I because components in the right side and components in the left side of the differential pair are substantially symmetrical. The differential pair is coupled to the voltage source VDD and thus the output voltage VD is generated at the second end of the fourth transistor 114, as in Formula (8).

$$VD = VDD - \frac{I}{2} \times R3 = VDD - I \times Re1 = VDD - \frac{\left(VDD - V_{t1} - \sum_{k=1}^{n} V_{Dk}\right)}{R1} \times Re1 \qquad \text{Formula (8)}$$

In Formula (8), Re1 is the equivalent resistance of the second resistor 104 and the third resistor 106, which is the same as stated in Formula (2). Since the right side and the left side of the differential pair are symmetrical, Re1 is equal to the resistance of the second resistor 104 and the third resistor 106 in parallel. Also, the resistance of the second resistor 104 and the resistance of the third resistor 106 are substantially equal, therefore, $$Re1 = \frac{R3}{2}.$$

In this embodiment, the resistance ratio of the first resistor 102, the second resistor 104 and the third resistor 106 is 1:2:2, which means Re1=R1. Consequently, the output voltage VD is equal to $$V_{t1} + \sum_{k=1}^{n} V_{Dk}$$

according to Formula (8), that is, the value of the output voltage VD can be adjusted by changing the number of the diodes 520.

According to Formula (7), when the voltage source VDD varies, the bias current I flowing through the differential pair changes accordingly as in Formula (9). In Formula (9), dVDD represents a voltage variation of the voltage source VDD, and dI represents a current variation of the bias current I. At the same time, the output voltage VD at the second end of the fourth transistor 114 will also be changed as in Formula (10). In Formula (10), dVD represents a voltage variation of the output voltage VD. In Formula (10), if R1=Re1, then the voltage variation dVD of the output voltage VD is substantially equal to zero, namely, the output voltage VD remains fixed and does not change with the voltage variation dVDD of the voltage source VDD.

$$dI = \frac{dVDD}{R1}$$ Formula (9)

$$dVD = dVDD - \frac{dI}{2} \times R3 = dVDD - dI \times Re1 = dVDD - \frac{dVDD}{R1} \times Re1$$ Formula (10)

As illustrated above, in FIG. 5, the fixed voltage generating circuit 500 is capable of generating a stable output voltage VD by adjusting the number of the diodes and the resistance ratio of the multiple resistors, therefore, the fixed voltage generating circuit 500 can use a GaAs process without the need of integrating a CMOS process. Also, the value of the output voltage VD can be adjusted according to system requirements by changing the number of the diodes.

Figure 8:
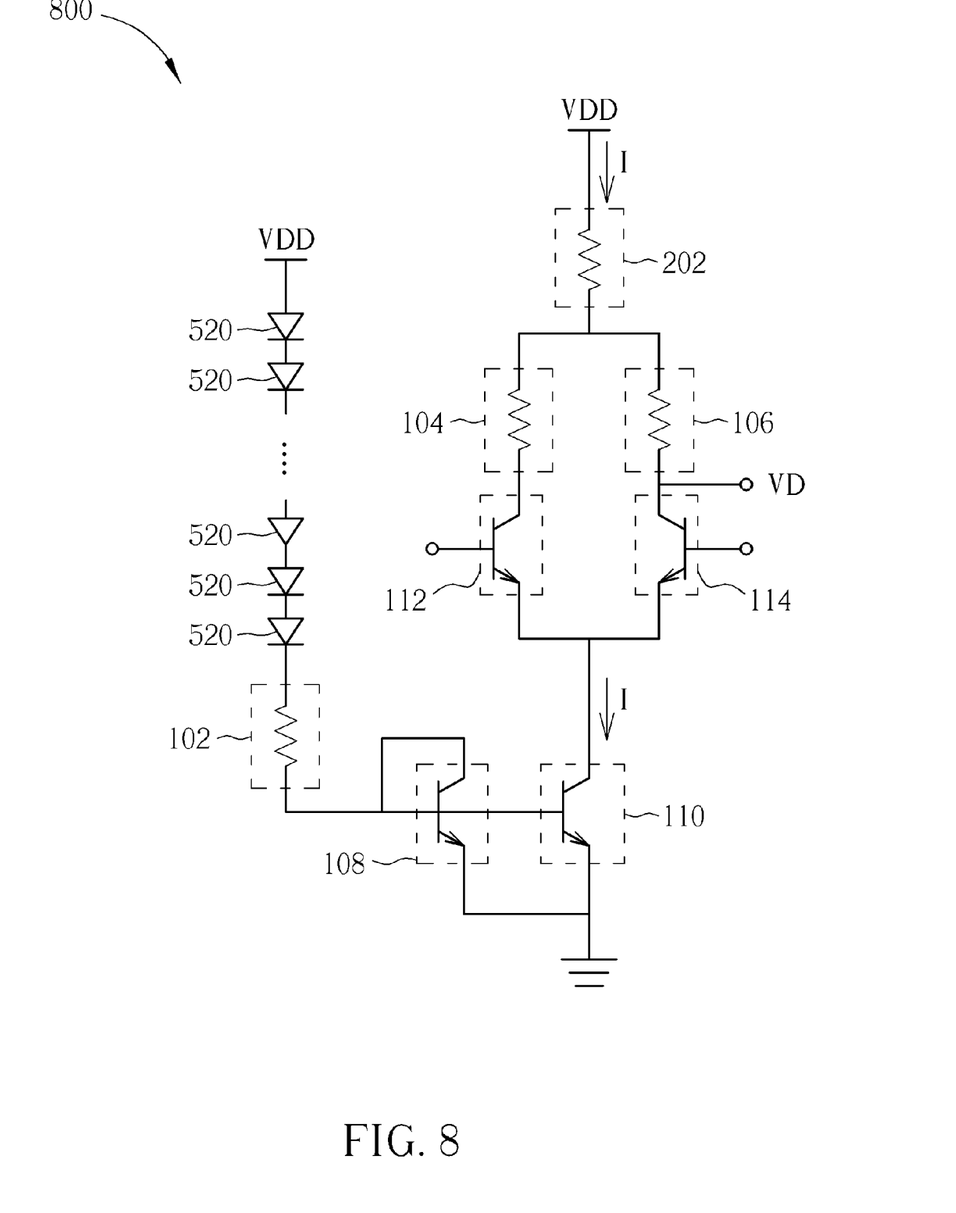

Please refer to FIG. 8 which shows a fixed voltage generating circuit 800 according to another embodiment of the present invention. The fixed voltage generating circuit 800 includes all components of the fixed voltage generating circuit 200 and further includes n diodes 520 where n is a positive integer. The n diodes 520 are all forward biased and are in series with the first resistor 102. That is, for each diode 520, its anode voltage is higher than its cathode voltage.

The fixed voltage generating circuit 800 in FIG. 8 has the same operation principle as the fixed voltage generating circuit 200 in FIG. 2 and the difference between these two is that the bias current I in FIG. 8 is as in Formula (7), instead of Formula (2). In FIG. 8, the bias current I flows through the fourth resistor 202 and the differential pair composed of the third transistor 112, the fourth transistor 114, the second resistor 104, and the third resistor 106. A current flowing through the right side of the differential pair, including the fourth transistor 114 and the third resistor 106, is half the bias current I because components in the right side and components in the left side of the differential pair are substantially symmetrical. The output voltage VD is thus generated at the second end of the fourth transistor 114, as in Formula (11):

$$VD = VDD - I \times R4 - \frac{I}{2} \times R3 = VDD - I \times Re2 = VDD - \frac{\left(VDD - V_{t1} - \sum_{k=1}^{n} V_{Dk}\right)}{R1} \times Re2$$ Formula (11)

Re2 is the equivalent resistance of the second resistor 104, the third resistor 106, and the fourth resistor 202. Since the differential pair is a symmetric structure, the equivalent resistance of the second resistor 104 and the third resistor 106 is equal to the resistance of the second resistor 104 and the third resistor 106 in parallel. Re2 is equal to the resistance of the second resistor 104 and the third resistor 106 in parallel plus the resistance of the fourth resistor 202. The resistance of the second resistor 104 and the resistance of the third resistor 106 are substantially equal. Thus $$Re2 = \frac{R3}{2} + R4.$$

According to Formula (11), the output voltage VD is $$V_{t1} + \sum_{k=1}^{n} V_{Dk}$$

while Re2 is equal to R1.

According to Formula (7), when the voltage source VDD varies, the bias current I flowing through the differential pair changes accordingly as in Formula (9). At the same time, the output voltage VD at the second end of the fourth transistor 114 will also be changed as in Formula (12). In Formula (12), dVD represents a voltage variation of the output voltage VD. In Formula (12), if R1=Re2, then the voltage variation dVD of the output voltage VD is substantially equal to zero, namely, the output voltage VD remains fixed and does not change with the voltage variation dVDD of the voltage source VDD.

$$dVD = dVDD - dI \times R4 - \frac{dI}{2} \times R3 = dVDD - dI \times Re2 = dVDD - \frac{dVDD}{R1} \times Re2$$ Formula (12)

As illustrated above, in FIG. 8, the fixed voltage generating circuit 800 is capable of generating a stable output voltage VD by adjusting the number of the diodes and the resistance ratio of the multiple resistors, therefore, the fixed voltage generating circuit 800 can use a GaAs process without the need of integrating a CMOS process. Also, the value of the output voltage VD can be adjusted according to system requirements by changing the number of the diodes.

Figure 9:
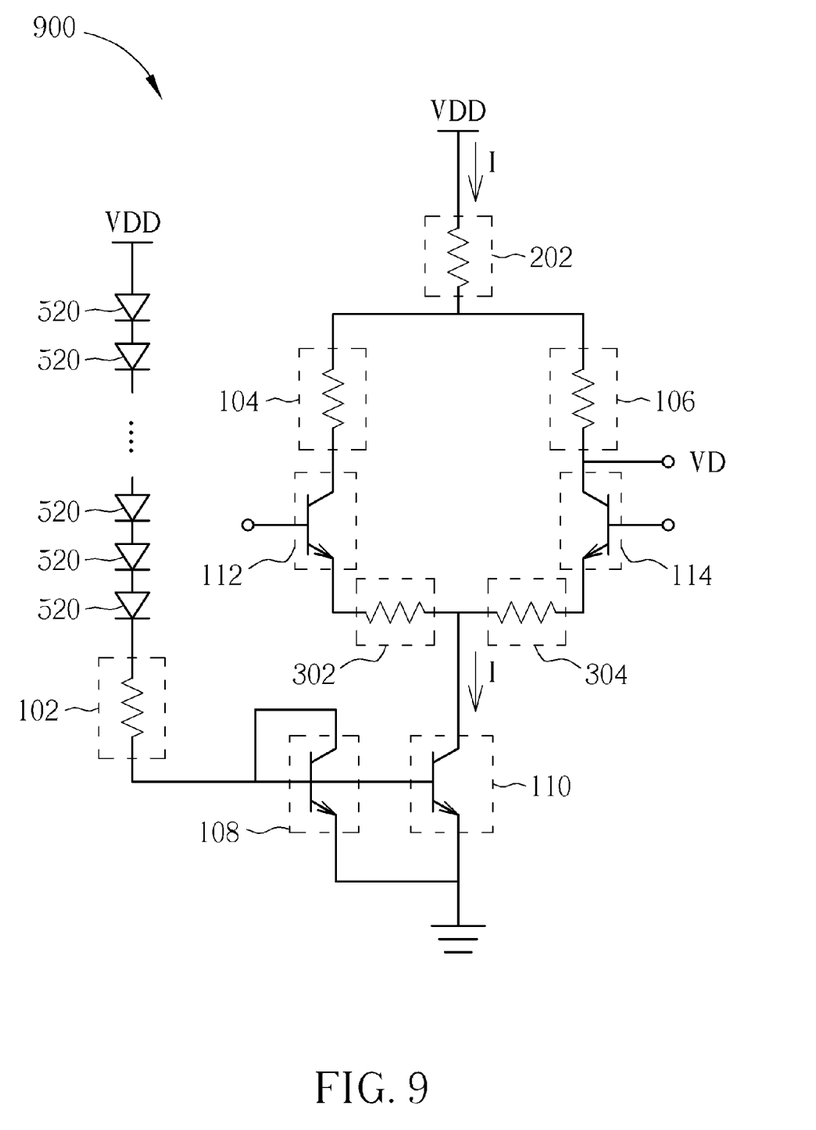

Please refer to FIG. 9 which shows a fixed voltage generating circuit 900 according to another embodiment of the present invention. The fixed voltage generating circuit 900 includes all components of the fixed voltage generating circuit 300 and further includes n diodes 520 where n is a positive integer. The n diodes 520 are all forward biased and are in series with the first resistor 102. That is, for each diode 520, its anode voltage is higher than its cathode voltage.

The bias current I in FIG. 9 flows through the fourth resistor 202, the differential pair, the fifth resistor 302, and the sixth resistor 304. A current flowing through the right side of the differential pair is half the bias current I as the resistance of the second resistor 104 equals to the resistance of the third resistor 106 and the resistance of the fifth resistor 302 equals to the resistance of the sixth resistor 304. The same principle of Formula (7), (9), (11), and (12) can be applied in FIG. 9. As long as R1=Re2, that is, the resistance of the first resistor 102 is substantially equal to the equivalent resistance Re2 of the second resistor 104, the third resistor 106, and the fourth resistor 202, the voltage variation dVD of the output voltage VD is substantially equal to zero, namely, the output voltage VD remains fixed and does not change with the voltage variation dVDD of the voltage source VDD. Also, the value of the output voltage VD can be adjusted by changing the number of the diodes 520.

Figure 10:
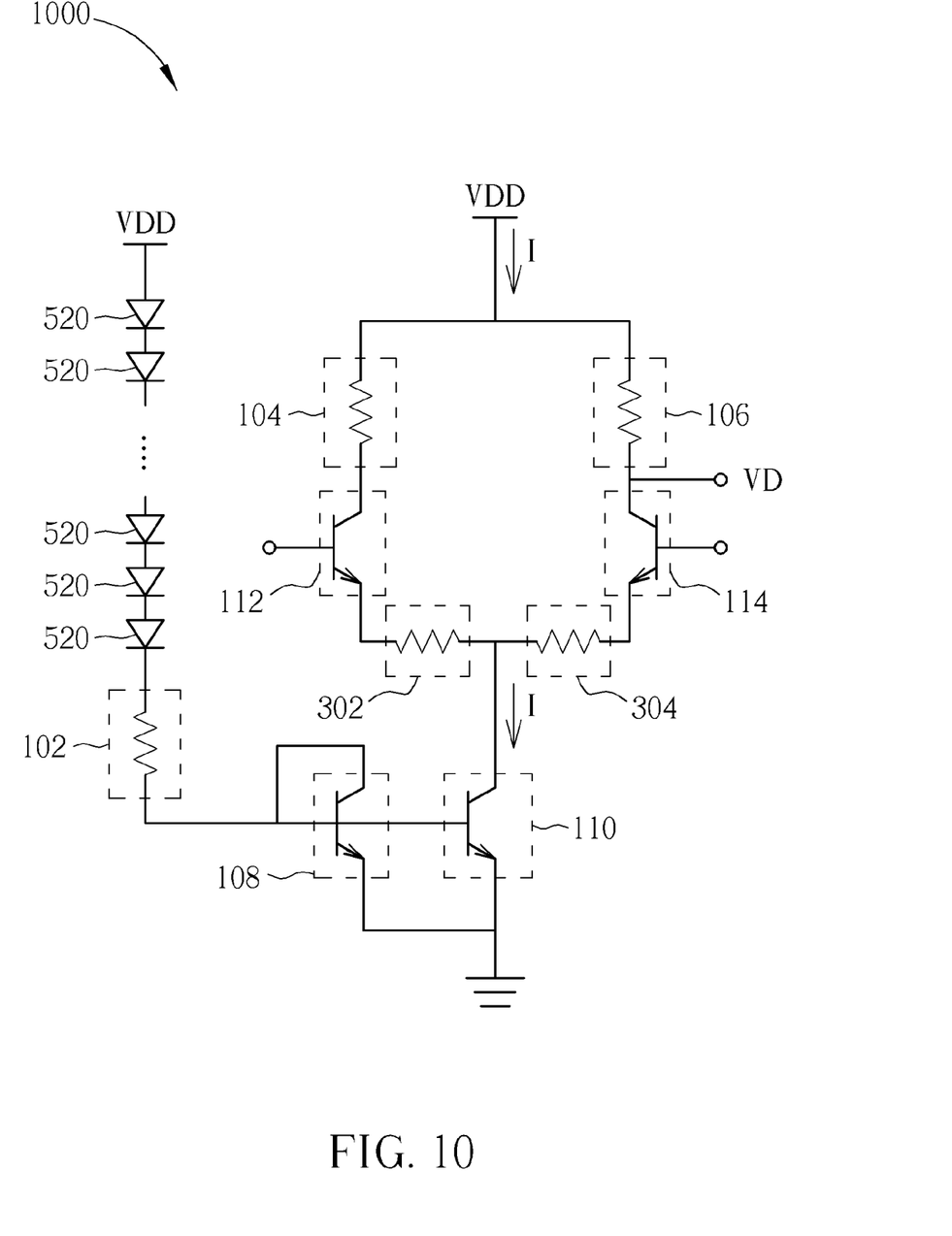

Please refer to FIG. 10 which is a schematic illustrating a fixed voltage generating circuit 1000 according to an embodiment of the present invention. The fixed voltage generating circuit 1000 includes all components of the fixed voltage generating circuit 400 and further includes n diodes 520, where n is a positive integer. The n diodes 520 are all forward biased and are in series with the first resistor 102. That is, for each diode 520, its anode voltage is higher than its cathode voltage.

The bias current I in FIG. 10 flows through the differential pair, the fifth resistor 302, and the sixth resistor 304. A current flowing through the right side of the differential pair is half the bias current I as the resistance of the fifth resistor 302 equals to the resistance of the sixth resistor 304. The same principles of Formula (7) to (10) may be applied in FIG. 10. As long as R1=Re1, that is, the resistance of the first resistor 102 is substantially equal to the equivalent resistance Re1 of the second resistor 104 and the third resistor, the voltage variation dVD of the output voltage VD is substantially equal to zero, namely, the output voltage VD remains fixed and does not change with the voltage variation dVDD of the voltage source VDD. Also, the value of the output voltage VD can be adjusted by changing the number of the diodes 520.

Furthermore, the diodes 520 in FIG. 8~10 are disposed between the voltage source VDD and the first resistor 102. In another embodiment, the first resistor 102 can be disposed between the voltage source VDD and the n diodes 520. In yet another embodiment, the first resistor 102 can be disposed between any two of the diodes 520. Furthermore, the first resistor 102 can be formed by a plurality of resistors distributed anywhere between the voltage source VDD and the control end of the first transistor 108 where the equivalent resistance of the plurality of resistors equal to the resistance of the first resistor 102. However, this invention is not limited to the aforesaid embodiments.

In summary, the present invention discloses fixed voltage generating circuits that are capable of generating a stable output voltage so that the fixed voltage generating circuits are able to work under a wide range of input voltages. Also, the output voltage can be adjusted according to system requirements by changing the number of the diodes. Since the proposed fixed voltage generating circuits are able to output a stable voltage by adjusting the number of diodes and the resistance ratio of multiple resistors, the proposed fixed voltage generating circuits can use a GaAs process without the need of integrating a CMOS process so as to reduce area consumption and to enhance integration level of related circuit blocks.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A fixed voltage generating circuit comprising:
    a first resistor having a first end and a second end, the second end of the first resistor being coupled to a voltage source;
    a first transistor having a first end, a second end, and a control end, the control end of the first transistor being coupled to the first end of the first resistor, the first end of the first transistor being coupled to a ground node, and the second end of the first transistor being coupled to the control end of the first transistor;
    a second transistor having a first end, a second end, and a control end, the control end of the second transistor being coupled to the control end of the first transistor, and the first end of the second transistor being coupled to the ground node;
    a third transistor having a first end, a second end, and a control end, the control end of the third transistor being configured to receive a first differential voltage, and the first end of the third transistor being coupled to the second end of the second transistor;
    a fourth transistor having a first end, a second end, and a control end, the control end of the fourth transistor being configured to receive a second differential voltage, and the first end of the fourth transistor being coupled to the second end of the second transistor;
    a second resistor having a first end and a second end, the first end of the second resistor being coupled to the second end of the third transistor, and the second end of the second resistor being coupled to the voltage source; and
    a third resistor having a first end and a second end, the first end of the third resistor being coupled to the second end of the fourth transistor, and the second end of the third resistor being coupled to the voltage source;
    wherein a resistance of the second resistor and a resistance of the third resistor are related to a resistance of the first resistor.

2. The fixed voltage generating circuit of claim 1, wherein an equivalent resistance of the second resistor and the third resistor is substantially equal to the resistance of the first resistor; and a size ratio of the first transistor and the second transistor is 1:1.

3. The fixed voltage generating circuit of claim 1, wherein a current mirror is formed by the first transistor and the second transistor; and a size ratio of the first transistor and the second transistor is 1:N or N:1, wherein N is a positive integer.

4. The fixed voltage generating circuit of claim 1 further comprising n diodes coupled between the voltage source and the control end of the first transistor; wherein n is a positive integer.

5. The fixed voltage generating circuit of claim 4, wherein the diodes are junction diodes, field effect transistors, or bipolar junction transistors.

6. The fixed voltage generating circuit of claim 1, wherein the fixed voltage generating circuit is formed by a GaAs (GALLIUM ARSENIDE) process.

7. A fixed voltage generating circuit comprising:
    a first resistor having a first end and a second end, the second end of the first resistor being coupled to a voltage source;
    a first transistor having a first end, a second end, and a control end, the control end of the first transistor being coupled to the first end of the first resistor, the first end of the first transistor being coupled to a ground node, and the second end of the first transistor being coupled to the control end of the first transistor;
    a second transistor having a first end, a second end, and a control end, the control end of the second transistor being coupled to the control end of the first transistor, and the first end of the second transistor being coupled to the ground node;
    a third transistor having a first end, a second end, and a control end, the control end of the third transistor being configured to receive a first differential voltage, and the first end of the third transistor being coupled to the second end of the second transistor;
    a fourth transistor having a first end, a second end, and a control end, the control end of the fourth transistor being configured to receive a second differential voltage, and the first end of the fourth transistor being coupled to the second end of the second transistor;

a second resistor having a first end and a second end, the first end of the second resistor being coupled to the second end of the third transistor;

a third resistor having a first end and a second end, the first end of the third resistor being coupled to the second end of the fourth transistor; and a fourth resistor having a first end and a second end, the first end of the fourth resistor being coupled to the second end of the second resistor and the second end of the third resistor, and the second end of the fourth resistor being coupled to the voltage source;

wherein a resistance of the second resistor, a resistance of the third resistor, and a resistance of the fourth resistor are related to a resistance of the first resistor.

8. The fixed voltage generating circuit of claim 7, wherein an equivalent resistance of the second resistor, the third resistor, and the fourth resistor is substantially equal to the resistance of the first resistor; and a size ratio of the first transistor and the second transistor is 1:1.

9. The fixed voltage generating circuit of claim 7, wherein a current mirror is formed by the first transistor and the second transistor; and a size ratio of the first transistor and the second transistor is 1:N or N:1, wherein N is a positive integer.

10. The fixed voltage generating circuit of claim 7 further comprising n diodes coupled between the voltage source and the control end of the first transistor; wherein n is a positive integer.

11. The fixed voltage generating circuit of claim 10, wherein the diodes are junction diodes, field effect transistors, or bipolar junction transistors.

12. The fixed voltage generating circuit of claim 7, wherein the fixed voltage generating circuit is formed by a GaAs (GALLIUM ARSENIDE) process.

13. The fixed voltage generating circuit of claim 7 further comprising:

a fifth resistor coupled between the first end of the third transistor and the second end of the second transistor; and a sixth resistor coupled between the first end of the fourth transistor and the second end of the second transistor.

14. The fixed voltage generating circuit of claim 13 further comprising n diodes coupled between the voltage source and the control end of the first transistor; wherein n is a positive integer.

15. A fixed voltage generating circuit comprising:

a first resistor having a first end and a second end, the second end of the first resistor being coupled to a voltage source;

a first transistor having a first end, a second end, and a control end, the control end of the first transistor being coupled to the first end of the first resistor, the first end of the first transistor being coupled to a ground node, and the second end of the first transistor being coupled to the control end of the first transistor;

a second transistor having a first end, a second end, and a control end, the control end of the second transistor being coupled to the control end of the first transistor, and the first end of the second transistor being coupled to the ground node;

a third transistor having a first end, a second end, and a control end, the control end of the third transistor being configured to receive a first differential voltage;

a fourth transistor having a first end, a second end, and a control end, the control end of the fourth transistor being configured to receive a second differential voltage;

a second resistor having a first end and a second end, the first end of the second resistor being coupled to the second end of the third transistor, and the second end of the second resistor being coupled to the voltage source;

a third resistor having a first end and a second end, the first end of the third resistor being coupled to the second end of the fourth transistor, and the second end of the third resistor being coupled to the voltage source;

a fifth resistor having a first end and a second end, the first end of the fifth resistor being coupled to the second end of the second transistor, and the second end of the fifth resistor being coupled to the first end of the third transistor; and a sixth resistor having a first end and a second end, the first end of the sixth resistor being coupled to the second end of the second transistor, and the second end of the sixth resistor being coupled to the first end of the fourth transistor;

wherein a resistance of the second resistor and a resistance of the third resistor are related to a resistance of the first resistor.

16. The fixed voltage generating circuit of claim 15, wherein an equivalent resistance of the second resistor and the third resistor is substantially equal to the resistance of the first resistor; and a size ratio of the first transistor and the second transistor is 1:1.

17. The fixed voltage generating circuit of claim 15, wherein a current mirror is formed by the first transistor and the second transistor; and a size ratio of the first transistor and the second transistor is 1:N or N:1, wherein N is a positive integer.

18. The fixed voltage generating circuit of claim 15 further comprising n diodes coupled between the voltage source and the control end of the first transistor; wherein n is a positive integer.

19. The fixed voltage generating circuit of claim 18, wherein the diodes are junction diodes, field effect transistors, or bipolar junction transistors.

20. The fixed voltage generating circuit of claim 15, wherein the fixed voltage generating circuit is formed by a GaAs (GALLIUM ARSENIDE) process.

* * * * *